(12) United States Patent
Ono

(10) Patent No.: US 7,759,751 B2
(45) Date of Patent: Jul. 20, 2010

(54) MODULE FOR OPTICAL APPARATUS AND METHOD OF PRODUCING MODULE FOR OPTICAL APPARATUS

(75) Inventor: Atsushi Ono, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 510 days.

(21) Appl. No.: 11/783,614

(22) Filed: Apr. 10, 2007

(65) Prior Publication Data

US 2008/0211045 A1 Sep. 4, 2008

(30) Foreign Application Priority Data

Apr. 11, 2006 (JP) ............................. 2006-109147

(51) Int. Cl.
*H01L 31/18* (2006.01)
(52) U.S. Cl. ................. 257/432; 257/433; 257/434; 257/E31.127
(58) Field of Classification Search ............ 257/432, 257/433, 434, E31.127
See application file for complete search history.

(56) References Cited

U.S. PATENT DOCUMENTS

| 2001/0050717 | A1 | 12/2001 | Yamada et al. |
| 2004/0130640 | A1* | 7/2004 | Fujimori ...................... 348/294 |
| 2004/0189854 | A1 | 9/2004 | Tsukamoto et al. |
| 2004/0245649 | A1 | 12/2004 | Imaoka |
| 2005/0163016 | A1 | 7/2005 | Kimura |
| 2005/0205898 | A1 | 9/2005 | Van Arendonk et al. |
| 2006/0197007 | A1 | 9/2006 | Iwabuchi et al. |
| 2006/0249737 | A1 | 11/2006 | Fujimori |

FOREIGN PATENT DOCUMENTS

| JP | 2001-351997 A | 12/2001 |
| JP | 2001-358997 A | 12/2001 |
| JP | 2002-182270 | 6/2002 |
| JP | 2004-207461 A | 7/2004 |
| JP | 2004-221874 A | 8/2004 |
| JP | 2004-319758 A | 11/2004 |
| JP | 2005-528791 A | 9/2005 |
| JP | 2007-13089 A | 1/2007 |
| KR | 2002-0085120 A | 11/2002 |
| KR | 10-2004-0084989 A | 10/2004 |
| KR | 10-2005-0120142 A | 12/2005 |
| KR | 10-2006-0020930 A | 3/2006 |
| WO | 03/103014 A2 | 12/2003 |

* cited by examiner

*Primary Examiner*—Tan N Tran
(74) *Attorney, Agent, or Firm*—Nixon & Vanderhye P.C.

(57) ABSTRACT

An electric wiring of a module for an optical apparatus includes: a first through electrode passing through the solid-state image sensor; a first rewiring layer being formed in such a way as to be re-wired to a necessary area in the rear surface of the solid-state image sensor, and being electrically connected to the first through electrode; a second rewiring layer being formed in such a way as to be re-wired to a necessary area in the rear surface of the image processing apparatus, and being electrically connected to the first rewiring layer; a second through electrode passing through the image processing apparatus and being electrically connected to the second rewiring layer; and a third rewiring layer being formed in such a way as to be re-wired to a necessary area in a front surface of the image processing apparatus, and being electrically connected to the second through electrode. The image processing apparatus includes an external connection terminal electrically connected to the third rewiring layer. With the foregoing structure, a small and light module for an optical apparatus and a production method of such module are realized without giving a constraint on the structure of the module.

13 Claims, 6 Drawing Sheets

MODULE FOR OPTICAL APPARATUS AND METHOD OF PRODUCING MODULE FOR OPTICAL APPARATUS

This Nonprovisional application claims priority under 35 U.S.C. §119(a) on Patent Application No. 109147/2006 filed in Japan on Apr. 11, 2006, the entire contents of which are hereby incorporated by reference.

FIELD OF THE INVENTION

The technology presented herein relates to a module for an optical apparatus, which module includes a solid-state image sensor and an image processing apparatus for processing an electric signal supplied from the solid-state image sensor. The present technology also relates to a method of producing the module.

BACKGROUND

In recent years, modules for optical apparatuses that are to be installed in optical apparatuses, such as digital cameras and mobile phones with camera functions, have been developed (for example, Japanese Unexamined Patent Publication No. 2002-182270 (publication date: Jun. 26, 2002)).

The following explains, as an exemplary conventional module for an optical apparatus, which module includes a solid-state image sensor, such as a CCD (Charge Coupled Device) and a CMOS (Complementary Metal Oxide Semiconductor) imager, and a camera module 120 taught in Japanese Unexamined Patent Publication No. 2002-182270, with reference to FIG. 7. FIG. 7 is a sectional view showing a structure of the camera module 120.

As shown in FIG. 7, the module 120 for an optical apparatus includes a wiring board 106 and conductor wirings 110, which are formed on both surfaces of the wiring board 106. The conductor wirings 110 are suitably connected to each other inside of the wiring board 106. An image processing apparatus 104 is bonded to the wiring board 106 by die-bonding via a die-bonding material 107. A connection terminal 109 of the image processing apparatus 104 is electrically connected to the conductor wirings 110 via a bonding wire 112. Further, a chip component 113 is mounted on the wiring board 106.

Further, a spacer chip 102 is bonded to the image processing apparatus 104 via an insulative bonding agent 105. A solid-state image sensor 101 is bonded to a plane surface of the spacer chip 102 via an insulative bonding agent 103. Further, a transparent cover section 114 is provided above the solid-state image sensor 101.

In this conventional structure, every connection terminals of the image processing apparatus 104 and every connection terminals of the solid-state image sensor 101 are electrically connected to the conductor wirings 110 via the bonding wire 111 or the bonding wire 112. This requires a space for the bonding wires 111-112 and the conductor wirings 110, which are to be connected to the wires 111-112, causing the module to increase in size.

Further, with the conventional structure, there arises a problem that an optical distance from the lens 115 to the solid-state image sensor 101 does not correspond to a focal length f of the lens 115 due variations, such as warping and deflection, occurred during the steps of producing the wiring board 106 or after the wiring board 106 is mounted.

FIG. 8 is a diagram showing an example of such defects. The figure shows a case in which a central section of the wiring board 106 is protruded. As shown in FIG. 8, the lens 115, the central section of the wiring board 106, and the solid-state image sensor 101, which is provided at the central section of the wiring board 106, are maintained parallel to one another, but both ends of the wiring board 106 are depressed with respect to the center. Accordingly, a lens-holder main-body 117 bonded to the wiring board 106 moves downward with respect to the central section of the wiring board 106. In other words, a reference for positioning the lens 115 moves downward. As a result, the optical distance from the lens 115 to the solid-state image sensor 101 becomes f−Δf (Δf indicates an amount of change in the thickness of the wiring board 106), diverging from the focal length f of the lens 115.

In this case, a focus adjuster 116 is rotated to adjust the optical distance, which is from the lens 115 to the solid-state image sensor 101, to the focal length f of the lens 115, thereby making the optical distance correspond to the focal length f of the lens 115. In other words, adjustment is made by Δf with the focus adjuster 116 to bring the solid-state image sensor 101 into a position that is away from the lens 115 by the focal length f.

As discussed above, in the conventional module for an optical apparatus, the lens-holder main body 117 is bonded to the wiring board 106 by using the wiring board 106 as a reference for positioning the lens 115. Hence, the optical distance from the lens 115 to the solid-state image sensor 101 sometimes differs from the focal length f of the lens 115 due variations, such as warping and deflection, in the wiring board 106.

This necessitates adjusting the optical distance, which is from the lens 115 to the solid-state image sensor 101, to the focal length f of the lens 115, with respect to every modules. This requires expensive equipments and workers. Further, this adjustment requires a skilled worker. Furthermore, the lens holder requires two mechanical components, the lens-holder main body 117 and the focus adjuster 116. It has been structurally difficult to decrease the size of the lens holder and therefore the size of the module. Further, being mechanical components, the components are difficult to manufacture on mass-production basis. Hence, the proportion of production costs of the lens holder with respect to production costs of the module is high. This causes the production costs to increase.

In view of the foregoing, there has been suggested a module for an optical apparatus to solve the problem of increase in size of the module and the problem of deviation in the focal length. For example, the module taught in Japanese Unexamined Patent Publication No. 2005-216970 (publication date: Aug. 11, 2005) (U.S. patent application publication No. 2005/0163016 (publication date: Jul. 28, 2005)) includes (a) a bonding section to bond a transparent cover section to a solid-state image sensor and (b) a coupling section to connect the transparent cover section and an optical-path defining unit, and the solid-state image sensor includes a through electrode, thereby decreasing the size of the module.

The following explains a module 220 for an optical apparatus that is taught in Japanese Unexamined Patent Publication No. 2005-216970, with reference to FIG. 9. FIG. 9 is a sectional view showing a structure of the module 220.

As shown in FIG. 9, the module 220 includes a solid-state image sensor 201, an image processing apparatus 202, a wiring board 203, and an optical-path defining unit 212, which defines an optical path to an effective pixel area 200 formed on the solid-state image sensor 201.

A pattern of the conductor wiring 204 is formed on both surfaces of the wiring board 203. The conductor wirings 204 are suitably connected to each other inside of the wiring board 203. The solid-state image sensor 201 includes a through electrode 207. The image forming apparatus 202 includes a through electrode 208. A rear surface of the solid-state image sensor 201 and a front surface (flat surface section) of the image processing apparatus 202 are bonded together with a bonding section 205. The through electrode 207 of the solid-state image sensor 201 and the through electrode 208 of the image processing apparatus 202 are electrically connected to each other.

Further, a rear surface of the image processing apparatus 202 and a front surface of the wiring board 203 are bonded together with a bonding section 206. The through electrode 208 of the image processing apparatus 202 and the conductor wiring 204 formed on the front surface of the wiring board 203 are electrically connected to each other.

With this structure, no space for the bonding wires to be provided is necessary in a laminate of the solid-state image sensor 201, the image processing apparatus 202, and the wiring board 203. This allows the module 220 to be reduced in size. For example, a distance from an edge section of the solid-state image sensor 201 to an inner wall of the optical-path defining unit 212 decreases, so that the size of the module 220 decreases.

The optical-path defining unit 212 is coupled with a transparent cover section 210 via a coupling section 213. The transparent cover section 210 is bonded, with a bonding agent 209, to a surface of the solid-state image sensor 201, on which surface the effective pixel area 200 is formed. The optical-path defining unit 212 holds a lens 211 on its internal surface at one end of one opening, in a manner such that the lens 211 faces the effective pixel area 200 of the solid-state image sensor 201 via the transparent cover section 210.

The other end of the optical-path defining unit 212 is coupled with the wiring board 203 via an adjustment section 214 formed of a bonding agent that maintains some flexibility even after being cured.

In this case, the optical distance from the lens 211 to the solid-state image sensor 201 is not affected by warping, deflection, or the like in the wiring board 203. Therefore, if the optical distance is designed in such a way as to match the focal length f of the lens 211, then the optical distance always matches the focal length f. This makes it unnecessary to adjust the optical distance to the focal length f of the lens 211. Accordingly, expensive equipments and workers for adjustment are become unnecessary, allowing significant reduction in costs.

However, in the module of Japanese Unexamined Patent Publication No. 2005-216970, although the optical-path defining unit 212 and the wiring board 203 are bonded together with the adjustment section 214, the solid-state image sensor 201, the image processing apparatus 202, and the transparent cover section 210 are squeezed in a space surrounded by the optical-path defining unit 212 and the wiring board 203. This causes defects such as overall distortion and partial breakage in the module.

Further, as the modules for optical apparatuses have been installed in portable devices widely in recent years, a smaller and lighter module has been demanded.

SUMMARY

The example embodiment presented herein has as a feature to provide a module for an optical apparatus and a method of producing the module, which module is reduced in size has a high degree of freedom in design. Another feature of the example embodiment is to reduce the size of the module without giving a constraint on the structure of the module.

To attain the above features, a module of the example embodiment for an optical apparatus is adapted so that the module includes: a solid-state image sensor including, on a front surface of the solid-state image sensor, an effective pixel area where photoelectric conversion is performed on incident light; an image processing apparatus provided in such a manner that a rear surface of the image processing apparatus faces a rear surface of the solid-state image sensor, and processing an electric signal produced in the effective pixel area as a result of the photoelectric conversion; and an electric wiring including: a first through electrode passing through the solid-state image sensor; a first rewiring layer electrically connected to the first through electrode and formed in such a way as to be re-wired to a necessary area in the rear surface of the solid-state image sensor; a second rewiring layer electrically connected to the first rewiring layer and formed in such a way as to be re-wired to a necessary area in the rear surface of the image processing apparatus; a second through electrode passing through the image processing apparatus and electrically connected to the second rewiring layer; and a third rewiring layer electrically connected to the second through electrode and formed in such a way as to be re-wired to a necessary area in a front surface of the image processing apparatus, the image processing apparatus including an external connection terminal electrically connected to the third rewiring layer.

With this structure, the first rewiring layer of the solid-state image sensor and the second and third rewiring layers of the image processing apparatus function as an electric wiring of a wiring board. This allows an electric wiring of the module to be constituted of: the first through electrode passing through the solid-state image sensor; the first rewiring layer formed in such a way as to be re-wired to a necessary area in the rear surface of the solid-state image sensor; the second through electrode passing through the image processing apparatus; the second rewiring layer formed in such a way as to be re-wired to a necessary area in the rear surface of the image processing apparatus; and the third rewiring layer formed in such a way as to be re-wired to a necessary area in the front surface of the image processing apparatus.

Accordingly, no wiring board is necessary, and therefore it becomes possible to reduce the size of the module in the direction of laminate. Further, no space is necessary for the bonding wire and the conductor wiring connected to the bonding wire, while such space is necessary in the structure in which a bonding wire is employed to make electric connection. This allows the size of the module to decrease in the direction along the front surface. Thus, a module is realized that is reduced in size and has a high degree of freedom in design relating to connection of electronic components such as a chip component.

A method of producing a module for an optical apparatus in accordance with the example embodiment is adapted so that the method of producing the module including (a) a solid-state image sensor including, on a front surface of the solid-state image sensor, an effective pixel area where photoelectric conversion is performed on incident light, and (b) an image processing apparatus provided in such a manner that a rear surface of the image processing apparatus faces a rear surface of the solid-state image sensor, and processing an electric signal produced in the effective pixel area as a result of the photoelectric conversion, the method comprising: forming an electric wiring of the module, including: forming a first through electrode passing through the solid-state image sensor; forming a first rewiring layer electrically connected to the first through electrode and formed in such a way as to be re-wired to a necessary area in the rear surface of the solid-state image sensor; forming a second rewiring layer electrically connected to the first rewiring layer and formed in such a way as to be re-wired to a necessary area in the rear surface of the image processing apparatus; forming a second through electrode passing through the image processing apparatus and electrically connected to the second rewiring layer; and forming a third rewiring layer electrically connected to the second through electrode and formed in such a way as to be re-wired to a necessary area in a front surface of the image processing apparatus, the method further comprising forming, on the front surface of the image processing apparatus, an external connection terminal electrically connected to the third rewiring layer.

With this method, it is possible to omit the step of producing a wiring board, which step is necessary in an electric wiring of a conventional module for an optical apparatus.

Further, the module produced by the method needs no wiring board. This allows the size of the module to be reduced in the direction of laminate. Further, no space is necessary for the bonding wire and the conductor wiring connected to the bonding wire, while such space is necessary in the structure in which a bonding wire is employed to make electric connection. This allows the size of the module to be reduced in the direction along the front surface. Thus, a module is realized that is reduced in size and has a high degree of freedom in design relating to connection of electronic components such as a chip component.

Additional features, and strengths of the example embodiment will be made clear by the description below. Further, the advantages of the example embodiment will be evident from the following explanation in reference to the drawings.

DESCRIPTION OF THE EMBODIMENTS

The following explains an embodiment, with reference to FIGS. 1 to 6.

Figure 1:
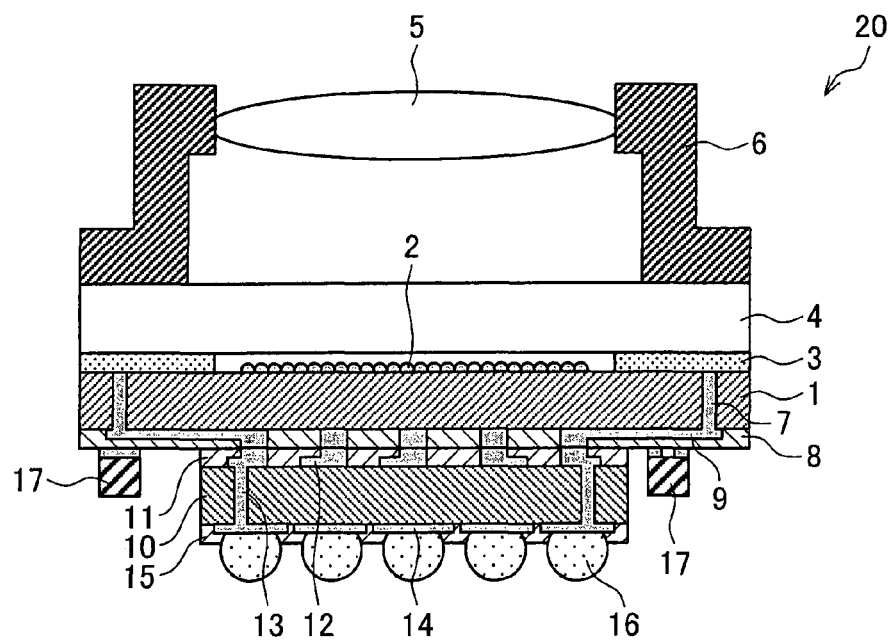
FIG. 1 is a sectional view showing a structure of a module for an optical apparatus, according to an example embodiment of the present invention.

FIG. 1 is a sectional view showing a structure of a module 20 for an optical apparatus, in accordance with the present embodiment.

As shown in FIG. 1, the module 20 of the present embodiment includes a solid-state image sensor 1, an image processing apparatus (DSP) 10, a transparent cover section 4, and an optical-path defining unit 6.

An effective pixel area 2 where photoelectric conversion is to be performed is formed in a central part of one surface of the solid-state image sensor 1. Hereinafter, the surface of the solid-state image sensor 1, on which surface the effective pixel area 2 is formed, will be referred to as a front surface, and an opposite surface to the front surface will be referred to as a rear surface.

The solid-state image sensor 1 includes, as electric wirings of the module 20, through electrodes (first through electrode) 7 and rear-surface rewirings (first rewiring layer) 9. The through electrodes 7 are formed in such a way as to pass through the solid-state image sensor 1, from the front surface and to the rear surface. The through electrodes 7 are connection terminals for sending, to the outside, an electric signal produced as a result of photoelectric conversion performed in the effective pixel area 2. The through electrodes 7 are made of a conductive material such as copper, and are disposed at a suitable distance away from the effective pixel area 2 in such a way as to surround the effective pixel area 2. The through electrodes 7 are provided in such a way as to keep a suitable distance from each other. Note that it is possible to suitably set the number and the positions of the through electrodes 7 on the basis of necessity of wirings in the effective pixel area 2.

Each of the rear-surface rewirings 9 is formed in such a way as to be re-wired to a necessary area in the rear surface of the solid-state image sensor 1. A rear-surface insulating film 8 is formed on the rear surface of the solid-state image sensor 1. The rear-surface insulating film 8 insulates and protects the rear-surface rewirings 9, except for a part of the rear-surface rewirings 9 via which part conduction is made with the outside.

The transparent cover section 4 is made of a transparent material such as glass and synthetic resin. The transparent cover section 4 is formed in such a way as to face the effective pixel area 2 formed on the front surface of the solid-state image sensor 1, and cover the effective pixel area 2. The transparent cover section 4 and the solid-state image sensor 1 are substantially same in perimeter of their surfaces via which the transparent cover section 4 and the solid-state image sensor 1 are in contact with each other. The transparent cover section 4 is fixed to the solid-state image sensor 1 via a bonding-agent layer 3.

The bonding-agent layer 3 is made of thermosetting resin that is photosensitive. Because the bonding agent is photosensitive, a pattern of the bonding-agent layer 3 is formed easily and highly accurately by carrying out exposure, developing, and the like with the use of a photolithography technique. Hence, the bonding-agent layer 3 is formed highly accurately, even if an area excluding the effective pixel area 2 in the front surface of the solid-state image sensor 1 is narrow.

Further, the bonding-agent layer 3 is formed in such a way as to seal an outer edge section of the solid-state image sensor 1 and an outer edge section of the transparent cover section 4. Hence, the bonding-agent layer 3 has a function to protect the effective pixel area 2, which is provided in between the solid-state image sensor 1 and the transparent cover section 4, from adhesion of and physical contact with foreign objects. The bonding-agent layer 3 prevents moisture from entering the effective pixel area and dust (dirt, scraps, etc.) from adhering to the effective pixel area. Accordingly, reliability of the solid-state image sensor 1 improves, and therefore reliability of the module 20 improves. Furthermore, after the solid-state image sensor 1 and the transparent cover section 4 are bonded together, no special protection of the effective pixel area 2 is necessary. This simplifies the steps in producing the module 20, allowing reduction in production costs.

The bonding-agent layer 3 is formed, at a suitable distance away from the effective pixel area 2, in such a way as to surround the effective pixel area 2 formed on the front surface of the solid-state image sensor 1 and form a space in between the effective pixel area 2 and the transparent cover section 4. No bonding-agent layer 3 is formed in between the effective pixel area 2 and the transparent cover section 4.

If, for example, the bonding section is formed in between the effective pixel area and the transparent cover section, loss of light such as attenuation and scattering occurs when incident light passes through the bonding section. On the contrary, with the structure of the present embodiment, light incident on the module 20 passes merely through a space after passing through the transparent cover section 4 and before reaching the effective pixel area 2 formed on the front surface of the solid-state image sensor 1, and does not pass through the bonding section or the like. Accordingly, a module is realized that is optically more advantageous than the module having the bonding section on the effective pixel area.

An infrared-light blocking film may be formed on the front surface of the transparent cover section 4 to block infrared-light externally incident on the transparent cover section 4, thereby adding a function of an optical filter. A solid-state image sensor 1 with such transparent cover section 4 is suitable to be installed in optical apparatuses such as a camera and a video recorder camera. The transparent cover section 4 may include a color filter.

An optical-path defining unit 6 is mounted on the front surface of the transparent cover section 4. As shown in FIG. 1, the optical-path defining unit 6 and the transparent cover section 4 are substantially same in perimeter of their surfaces via which the optical-path defining unit 6 and the transparent cover section 4 are in contact with each other. The optical-path defining unit 6 and the transparent cover section 4 are mounted on top of another in such a way as to align in the direction along the front surface. This allows the optical-path defining unit to be closely fixed to the transparent cover section, so that the optical-path defining unit is fixed more stably, compared to a conventional structure including a wiring board and an optical-path defining unit being fixed not only to a transparent cover section but also to the wiring board via an adjustment section. Further, the adjustment section is omissible. This allows the number of components to be reduced and the production steps to be simplified. Accordingly, unnecessary incident light is prevented at a lower cost than that in the conventional structure.

The inside of the optical-path defining unit 6 opens cylindrically. This opening is situated above the effective pixel area 2 on the solid-state image sensor 1. The optical-path defining unit 6 holds a lens 5 on an inner surface of the opening, in a manner such that an optical distance from the lens 5 to the solid-state image sensor 1 matches a focal length f of the lens 5.

In the present embodiment, the optical-path defining unit 6 holding the lens 5 is mounted directly on the transparent cover section 4. Hence, no deviation occurs in the optical distance from the lens 5 to the solid-state image sensor 1, while such deviation is observed in the conventional modules for optical apparatuses due to external factors such as warping or deflection in the wiring board.

As shown in FIG. 1, the solid-state image sensor 1, the optical-path defining unit 6, and the transparent cover section 4 are mounted on top of another in a manner such that their perimeters substantially align in the direction along the front surface.

The following explains a structure of the image processing apparatus 10. The image processing apparatus 10 is a plate-shaped semiconductor chip. A plurality of through electrodes (second through electrode) 13 are formed in such a way as to pass through the image processing apparatus 10 from a rear surface to a front surface of the image processing apparatus 10. A rear-surface wiring layer (second rewiring layer) 12 is formed on the rear surface (the surface facing the solid-state image sensor 1) of the image processing apparatus 10. A front-surface rewiring (third rewiring layer) 14 is formed on the front surface of the image processing apparatus 10. The solid-state image sensor 1 and the image processing apparatus 10 are electrically connected to each other via the through electrodes 7, the rear-surface rewirings 9, the rear-surface rewiring 12, and the through electrodes 13.

The image processing apparatus 10 controls operations of the solid-state image sensor 1 by passing a control signal to the solid-state image sensor 1 via the through electrodes 13, the rear-surface rewiring 12, the rear-surface rewirings 9, and the through electrodes 7. The solid-state image sensor 1 outputs an electric signal via the through electrodes 7 and the rear-surface rewirings 9. The electric signal is then transmitted to the image processing apparatus 10 via the rear-surface rewiring 12 and the through electrodes 13. The image processing apparatus 10 processes the electric signal, and outputs the electric signal to the outside via the front-surface rewiring 14 and a solder electrode 16 (external connection terminal). The solder electrode 16 will be described below.

In the image processing apparatus 10, only a terminal that needs to be connected to the solid-state image sensor 1 and the chip component 17 is connected to the rear surface with a wiring via the through electrodes 13. The rest of terminals are re-wired to the solder electrode 16 with the front-surface rewiring 14. Further, the image processing apparatus 10, except for an area where the solder electrode 16 is formed, is insulated and protected by a front-surface protection film 15.

With this structure, the number of the through electrodes 13 to be formed through the image processing apparatus 10 is reduced as few as possible. This improves an yield of the image processing apparatus 10, allowing reduction in costs.

The terminal connected to the rear surface of the image processing apparatus 10 via the through electrodes 13 is re-wired, via the rear-surface rewiring 12, to a necessary area in the rear surface of the image processing apparatus 10. The rear-surface rewiring 12, except for an area via which the solid-state image sensor 1 and the chip component 17 are conducted, is insulated and protected by the rear-surface insulating film 11.

The rear-surface insulating film 8 on the solid-state image sensor 1 and the rear-surface insulating film 11 on the image processing apparatus 10 are bonded together. The rear-surface rewirings 9 on the solid-state image sensor 1 and the rear-surface rewiring 12 on the image processing apparatus 10 are electrically connected to each other. As shown in FIG. 1, the image processing apparatus 10 is formed smaller in planar dimension (perimeter) than the solid-state image sensor 1. This allows the chip component 17 to be mounted on a part of the rear surface of the solid-state image sensor 1 without a trouble, on which part the image processing apparatus 10 is not mounted.

As the foregoing explains, the module 20 in accordance with the present embodiment includes the solid-state image sensor 1 including, on the front surface of the solid-state image sensor 1, the effective pixel area 2 where photoelectric conversion is performed on incident light. The module 20 also includes the image processing apparatus 10 provided in such a manner that the rear surface of the image processing apparatus faces the rear surface of the solid-state image sensor 1. The image processing apparatus 10 processes an electric signal produced as a result of the photoelectric conversion in the effective pixel area 2. The electric wiring of the module 20 is constituted of: the through electrodes 7 passing through the solid-state image sensor 1; the rear-surface rewirings 9 being formed in such a way as to be re-wired to a necessary area in the rear surface of the solid-state image sensor 1, and being electrically connected to the first through electrodes 7; the rear-surface rewiring 12 being formed in such a way as to be re-wired to a necessary area in the rear surface of the image processing apparatus 10, and being electrically connected to the rear-surface rewirings 9; the through electrodes 13 passing through the image processing apparatus 10 and being electrically connected to the rear-surface rewiring 12; and the front-surface rewiring 14 being formed in such a way as to be re-wired to a necessary area in the front surface of the image processing apparatus 10, and being electrically connected to the through electrodes 13. The image processing apparatus 10 includes the solder electrode 16 electrically connected to the front-surface rewiring 14.

With this structure, the rear-surface rewirings 9 of the solid-state image sensor 1, and the rear-surface rewiring 12 and the front-surface rewiring 14 of the image processing apparatus 10 function as the electric wiring of the wiring board. This allows the electric wiring of the module 20 to be constituted of: the through electrodes 7 passing through the solid-state image sensor 1; the rear-surface rewirings 9 being formed in such a way as to be re-wired to a necessary area in the rear surface of the solid-state image sensor 1; the through electrodes 13 passing through the image processing apparatus 10; the rear-surface rewiring 12 being formed in such a way as to be re-wired to a necessary area in the rear surface of the image processing apparatus 10; and the front-surface rewiring 14 being formed in such a way as to be re-wired to a necessary area in the front surface of the image processing apparatus 10. This allows the module 20 to be significantly reduced in size in the direction along the front surface and in the direction of laminate. Further, because no wiring board is necessary, the degree of freedom in design increases. For example, an electronic component such as the chip component 17 is mounted without a trouble at a desired area in the rear surface of the solid-state image sensor 1 or in the rear surface of the image processing apparatus 10, and forms wire connection.

In other words, the rear-surface rewirings 9 of the solid-state image sensor 1 and the rear-surface rewiring 12 of the image processing apparatus 10 play a role of the electric wiring of the wiring board of the module 20 constituted of the solid-state image sensor 1, the image processing apparatus 10, and the chip component 17.

It is preferable that the module 20 be structured in the following manner. The module 20 further includes the optical-path defining unit 6, which defines the optical path to the effective pixel area 2, and the transparent cover section 4, which is provided to cover the effective pixel area 2. The optical-path defining unit 6, the transparent cover section 4, the solid-state image sensor 1, and the image processing apparatus 10 are stacked in this order from the light incident side. The transparent cover section 4 is fixed to the solid-state image sensor 1 via the bonding section 3. The optical-path defining unit 6 is supported solely by the transparent cover section 4.

With this structure, the optical-path defining unit 6, the transparent cover section 4, the solid-state image sensor 1, and the image processing apparatus 10 are mounted on top of another. This makes it possible to prevent defects, such as overall distortion and partial breakage in the module 20, without giving a constraint on the structure of the module 20.

Further, the optical-path defining unit 6 is supported solely by the transparent cover section 4. Therefore, the optical-path defining unit 6 is closely fixed to the transparent cover section 4, compared to the conventional structure including a wiring board and an optical-path defining unit being fixed not only to a transparent cover section but also to the wiring board via an adjustment section. This allows the optical-path defining unit 6 to be fixed more stably. Further, the adjustment section is omissible. This allows the number of components to be reduced and the steps in production to be simplified. Accordingly, not only reduction in size but also reduction in costs of the module 20 of the present embodiment are attained at the same time.

It is preferable in the module 20 for an optical apparatus that the perimeter of the optical-path defining unit 6 and the perimeter of the transparent cover section 4 substantially align in the direction along the front surface.

With this structure, the optical-path defining unit 6 is fixed to the transparent cover section 4 more closely with a compact structure of laminate. This assuredly prevents unnecessary light from entering.

Further, it is preferable that the perimeter of the solid-state image sensor 1 substantially aligns, in the direction along the front surface, with the perimeter of the optical-path defining unit 6 and the perimeter of the transparent cover section 4.

It is preferable in the module 20 that the bonding-agent layer 3 include a photosensitive bonding agent.

With this structure, the bonding-agent layer 3 is photosensitive. Therefore, a pattern of the bonding-agent layer 3 is formed easily and highly accurately by carrying out exposure, developing, and the like with the use of a photolithography technique. Hence, the bonding-agent layer 3 is formed highly accurately, even if an area excluding the effective pixel area 2 in the front surface of the solid-state image sensor 1 is narrow.

It is preferable in the module 20 that the bonding-agent layer 3 be formed to surround the effective pixel area 2 and to form a space in between the effective pixel area 2 and the transparent cover section 4.

If, for example, the bonding-agent layer 3 is formed in between the effective pixel area 2 and the transparent cover section 4, loss of light, such as attenuation and scattering, occurs when incident light passes through the bonding-agent layer 3. On the contrary, with the above structure, light incident on the module 20 passes merely through a space after passing through the transparent cover section 4 and before reaching the effective pixel area 2 formed on the front surface of the solid-state image sensor 1, and does not pass through the bonding-agent layer 3 or the like. Accordingly, a module is realized that is optically more advantageous than the module having the bonding-agent layer on the effective pixel area.

Further, it is preferable in the module 20 that the bonding-agent layer 3 seal an area surrounding the effective pixel area 2.

With this structure, the bonding-agent layer 3 seals a space between the solid-state image sensor 1 and the transparent cover section 4. This prevents moisture from entering the effective pixel area 2 and dust (dirt, scraps, etc.) from adhering to the effective pixel area 2. This improves reliability of the solid-state image sensor 1 and therefore improves reliability of the module 20. Further, after the solid-state image sensor 1 and the transparent cover section 4 are bonded together, no special protection of the effective pixel area 2 is necessary. This simplifies the steps in producing the module 20, allowing reduction in production costs.

It is preferable in the module 20 that the optical-path defining unit 6 hold the lens 5 provided in such a way as to face the effective pixel area 2.

With this structure, the optical-path defining unit 6, which holds the lens 5, is closely fixed to the transparent cover section 4. This allows the optical distance, which is from the lens 5 to the solid-state image sensor 1, to match the focal length of the lens more assuredly. Hence, no deviation occurs in the optical distance from the lens 5 to the solid-state image sensor 1, which deviation is observed in the conventional modules for optical apparatuses due to external factors such as warping or deflection in the wiring board. Accordingly, a compact module and a production method thereof are provided, which module requires no adjustment of the focal length without giving a constraint on the structure of the module.

In the module 20, the perimeter of the image processing apparatus 10 is shorter than the perimeter of the solid-state image sensor 1, and the perimeter of the image processing apparatus 10 comes inside, in the direction along the front surface, of the perimeter of the solid-state image sensor 1.

With this structure, the chip component 17 is provided at an area in the rear surface of the solid-state image sensor 1, in which area the image processing apparatus 10 is not mounted.

Further, the module 20 may include the chip component 17 mounted on the rear surface of the solid-state image sensor 1 and electrically connected to the rewiring 9.

Further, in the module 20, the perimeter of the solid-state image sensor 1 is shorter than the perimeter of the image processing apparatus 10, and the perimeter of the image processing apparatus 10 comes outside, in the direction along the front surface, of the perimeter of the solid-state image sensor 1.

Further, a chip component may be included that is mounted on the rear surface of the image processing apparatus 10 and electrically connected to the rear-surface rewiring 12.

Further, the perimeter of the solid-state image sensor 1 and the perimeter of the image processing apparatus 10 are substantially same in size and shape. The perimeter of the solid-state image sensor 1 and the perimeter of the image processing apparatus 10 deviate from each other in the direction along the front surface.

Further, the module 20 may include a chip component 17 mounted on the rear surface of the solid-state image sensor 1 and electrically connected to the rear-surface rewirings 9, and a chip component 17 mounted on the rear surface of the image processing apparatus 10 and electrically connected to the rear-surface rewiring 12.

Further, in the module 20, a plurality of terminals may be included, and only a terminal to be connected to the solid-state image sensor 1 and a terminal to be connected to the chip component, among the terminals, are connected to the rear-surface rewiring 12 via the through electrode 13.

Figure 2:
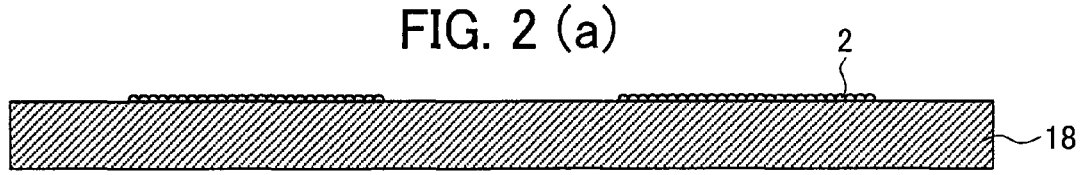
FIGS. 2(a) to 2(d) are schematic diagrams showing steps of producing the module of the present invention example embodiment.
Figure 2:
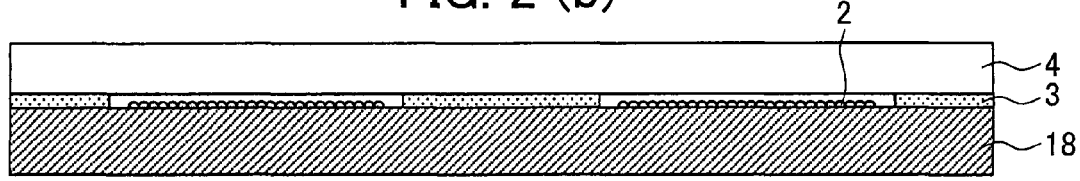
Figure 2:
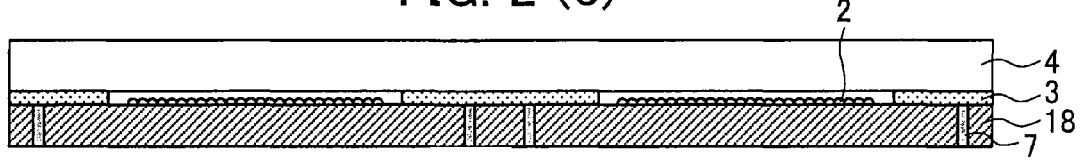
Figure 2:
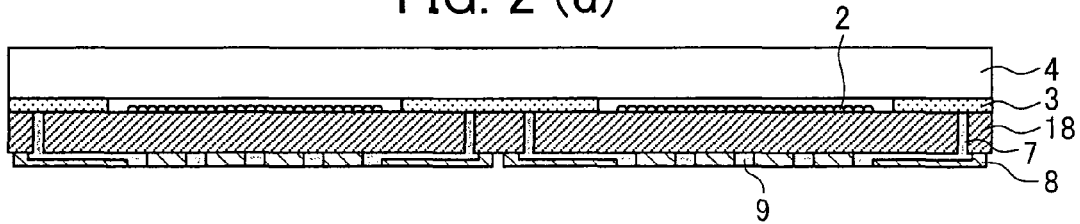
Figure 3:
FIGS. 3(a) to 3(f) are schematic diagrams showing steps of producing the module of the present invention example embodiment.
Figure 3:
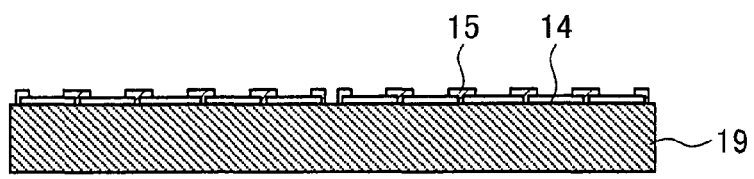
Figure 3:
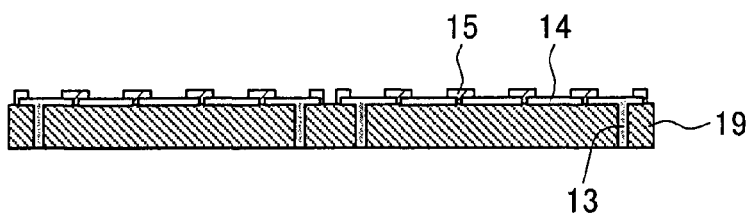
Figure 3:
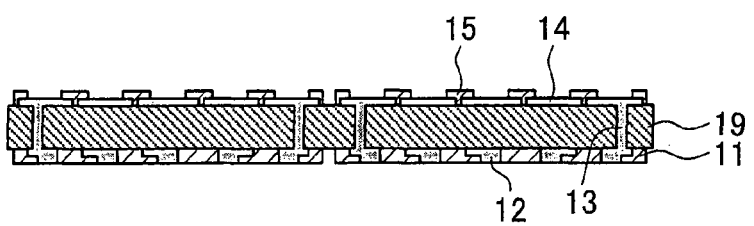
Figure 3:
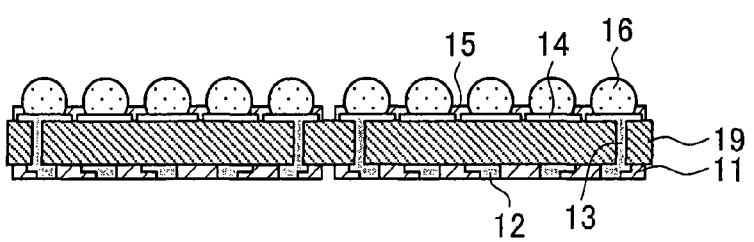
Figure 3:
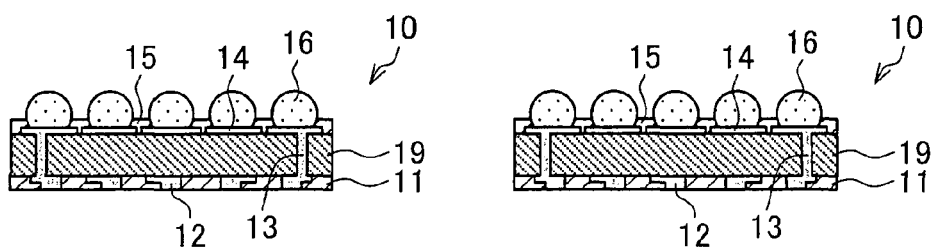

The following explains a method of producing the module 20, in accordance with the present embodiment, with reference to FIGS. 2(*a*) to 4(*c*).

First of all, the following explains a method of processing the solid-state image sensor 1 and the transparent cover section 4, with reference to FIGS. 2(*a*) to 2(*d*).

As shown in FIG. 2(*a*), a semiconductor circuit including the effective pixel area 2 is formed on a front surface of a semiconductor substrate 18.

Then, as shown in FIG. 2(*b*), the bonding-agent layer 3 is formed all over the semiconductor substrate 18 except for an area of the semiconductor substrate 18 on which area the effective pixel area 2 is formed. The bonding-agent layer 3 is formed by applying photosensitive bonding resin (e.g., bonding resin having both an acryl group that is photosensitive and an epoxy group that is thermosetting) evenly all over the semiconductor substrate 18, and then forming a pattern with the use of a photolithography technique. Thereafter, the transparent cover section 4 is mounted on top of the front surface of the solid-state image sensor 1, and pressure and heat are applied to bond the semiconductor substrate 18 and the transparent cover section 4 together.

To form the bonding-agent layer 3, the following methods are also available besides the photolithography: patterning bonding resin (e.g., epoxy resin) on the semiconductor substrate 18 by printing; drawing bonding resin by dispensing; adhering a bonding sheet on which a pattern is formed; and the like. A suitable method is selected on the basis of the circumstances.

Then, a rear surface, which is an opposite surface to the front surface to which the transparent cover section 4 is bonded, of the semiconductor substrate 18 is ground by ordinary rear-surface polishing, thereby reducing the thickness of the semiconductor substrate to 100 µm to 300 µm, which thickness is normally 500 µm to 800 µm. Following the rear-surface polishing, further polishing may be carried out by CMP (chemical-mechanical polish) to clean the surface thus polished, or etching may be carried out by RIE (Reactive Ion Etching).

Following this process of reducing the thickness of the semiconductor substrate 18, the through electrodes 7 are formed, as shown in FIG. 2(*c*), at predetermined areas by carrying out the following steps (FIG. 2(*c*)).

First, resist is applied to the rear surface of the semiconductor substrate 18. Then, windows are made by using a photolithography technique at areas where Si through holes are to be made. Then, dry etching is carried out on Si in the windows of the resist, thereby making through holes from the rear surface to the front surface of the semiconductor substrate 18. Then, an inorganic film, such as $SiO_2$ and $Si_3N_4$, is formed by CVD or the like to insulate the inside of the through holes, which inside is with bare Si. A polyimide or epoxy organic film may be applied to the insulating film.

Then, a Ti and Cu layer is formed by sputtering. The Ti and Cu layer is a seed layer for plating, and at the same time, a barrier metal layer.

Following the formation of the seed layer for plating, resist is applied, and windows are made by using a photolithography technique at areas where Cu is to be buried.

Then, electrolytic Cu plating is carried out to bury Cu into deep holes in Si. Lastly, the resist is eliminated, and unnecessary portions of the sputtered layer are also eliminated, thereby completing the formation of the through electrodes 7.

The following explains a method of forming the rear-surface rewirings 9 from the through electrodes 7 to predetermined areas, as shown in FIG. 2(*d*).

First, a rear-surface insulating layer (not illustrated) is formed to electrically insulate a rear surface of a wafer and the rewirings. Windows are made in the rear-surface insulating layer to allow the through electrodes 7 to be electrically connected to the rear-surface rewirings 9.

The rear-surface insulating layer is formed by applying a photosensitive organic film and carrying out exposure and developing to make windows at areas where necessary, and then carrying out thermal curing to harden the organic film.

In this case, it is also possible to form an inorganic film such as SiO2 and Si3N4 on the rear-surface insulating layer, apply resist, carry out exposure and developing, and then carry out etching to make the windows.

Then, the rear-surface rewirings 9 are formed from the openings of the rear-surface insulating layer to predetermined areas by the following steps.

First, a Ti and Cu layer is formed by sputtering. The Ti and Cu layer is a seed layer for plating, and at the same times a barrier metal layer. Then, resist is applied, exposure and developing are carried out to make windows at areas where a Cu-plated wiring is to be formed, and electrolytic Cu plating is carried out to form a wiring. Then, the resist is eliminated, and unnecessary portions of the sputtered layer are eliminated, thereby forming the rear-surface rewirings 9.

In this case, the wiring may be formed by the steps of forming a metal layer (Cu, CuNi, Ti, etc.) by sputtering, and after applying thereon resist, carrying out exposure, developing, and etching processes. Lastly, the rear-surface insulating film 8 is formed to protect the rear-surface rewirings 9, thereby completing the formation of the rear-surface rewirings 9.

In areas that need to be connected to the image processing apparatus 10, it is sufficient to form a protruded electrode (not illustrated) for connection.

The following explains a method of manufacturing the image processing apparatus 10, with reference to FIGS. 3(a) to 3(f).

First, as shown in FIG. 3(a), a semiconductor circuit is formed on a front surface of the semiconductor substrate 19.

Then, as shown in FIG. 3(b), only terminals that do not need to be connected to either of the solid-state image sensor 1 and the chip component 17 but need to be connected to the solder electrode 16 of the module are connected, via the front-surface rewiring 14, to land sections where the solder electrodes 16 are to be formed. Then, the front-surface protection film 15 is formed. The front-surface rewiring 14 is formed by the following steps.

First, a Ti and Cu layer is formed by sputtering. The Ti and Cu layer is a seed layer for plating, and at the same time, a barrier metal layer. Then, resist is applied, exposure and developing are carried out to make windows at areas where a Cu-plated wiring is to be formed, and electrolytic Cu plating is carried out to form a wiring. Then, the resist is eliminated, and unnecessary portions of the sputtered layer are eliminated, thereby forming the front-surface rewiring 14.

In this case, the wiring may be formed by the steps of forming a metal layer (Cu, CuNi, Ti, etc.) by sputtering, and after applying thereon resist, carrying out exposure, developing, and etching processes. Lastly, the front-surface insulating film 15 is formed to protect the front-surface rewiring 14.

Then, a surface, which is an opposite surface to the surface on which the front-surface rewiring 14 is formed, of the semiconductor substrate 19 is ground by ordinary rear-surface polishing so that the thickness of the semiconductor substrate is reduced to 100 μm to 300 μm, which thickness is normally 500 μm to 800 μm. Following the rear-surface polishing, further polishing may be carried out by CMP to clean the surface thus polished, or etching may be carried out by RIE.

Following the process of reducing the thickness of the semiconductor substrate 19, the through electrodes 13 are formed at predetermined areas by the following steps (FIG. 3(c)).

First, resist is applied to the rear surface of the semiconductor substrate 19. Then, windows are made by using a photolithography technique at areas where Si through holes are to be made. Then, dry etching is carried out on Si in the windows of the resist, thereby making through holes from the rear surface to the front surface of the semiconductor substrate 19. Then, an inorganic film, such as $SiO_2$ and $Si_3N_4$, is formed by CVD or the like to insulate the inside of the through holes, which inside is with bare Si. A polyimide or epoxy organic film may be applied to the insulating film.

Then, a Ti and Cu layer is formed by sputtering. The Ti and Cu layer is a seed layer for plating, and at the same time, a barrier metal layer.

Following the formation of the seed layer for plating, resist is applied, and windows are made by using a photolithography technique at areas where Cu is to be buried.

Then, electrolytic Cu plating is carried out to bury Cu into deep holes in Si.

Lastly, the resist is eliminated, and unnecessary portions of the sputtered layer are also eliminated, thereby completing the formation of the through electrodes 13.

The following explains a method of forming the rear-surface rewiring 12 from the through electrodes 13 to predetermined areas, as shown in FIG. 3(d).

First, a rear-surface insulating layer (not illustrated) is formed to electrically insulate a rear surface of a wafer and the rewirings. Windows are made in the rear-surface insulating layer to allow the through electrodes 13 to be electrically connected to the rewirings.

The rear-surface insulating layer is formed by applying a photosensitive organic film, carrying out exposure and developing to make windows at areas where necessary, and then carrying out thermal curing to harden the organic film.

In this case, it is also possible to form an inorganic film such as SiO2 and Si3N4 on the insulating layer, apply resist, carry out exposure and developing, and then carry out etching to make the windows.

Then, the rear-surface rewiring 12 is formed from the openings of the rear-surface insulating layer to predetermined areas.

The rear-surface rewiring 12 is formed by the following steps of: forming, by sputtering, a Ti and Cu layer that is a seed layer for plating, and at the same time, a barrier metal layer, and after applying thereon resist, carrying out exposure and developing to make windows at areas where a Cu-plated wiring is to be formed; carrying out electrolytic Cu plating to form a wiring; eliminating the resist and unnecessary portions of the sputtered layer.

In this case, the wiring may be formed by the steps of forming a metal layer (Cu, CuNi, Ti, etc.) by sputtering, and after applying thereon resist, carrying out exposure, developing, and etching processes.

Lastly, the rear-surface insulating film 11 is formed to protect the rear-surface rewiring 12.

In areas that need to be connected to the solid-state image sensor 1, it is sufficient to form a protruded electrode (not illustrated) for connection.

Then, as shown in FIG. 3(e), solder balls are mounted on the land areas connected to the front-surface rewiring 14, and are thermally treated, thereby forming the solder electrodes 16.

Lastly, the semiconductor substrate is divided by an ordinary dicing process to form the image processing apparatus 10, as shown in FIG. 3(f).

FIGS. 4(a) to 4(c) are sectional views for explaining a method of manufacturing the module 20, which includes the solid-state image sensor 1, the image processing apparatus 10, and the optical-path defining unit 6.

First, the image processing apparatus 10 manufactured by the steps shown in FIGS. 3(a) to 3(f) is mounted on the solid-state image sensor 1 manufactured by the steps discussed above and shown in FIGS. 2(a) to 2(d).

Concretely, a sheet of anisotropic and conductive bonding agent is affixed to the entire surface of the solid-state image sensor 1, which is in the form of wafer. Protruded electrodes of the solid-state image sensor 1 for connection and protruded electrodes of the image processing apparatus 10 for connection are joined together to mount the image processing apparatus 10.

Figure 4:
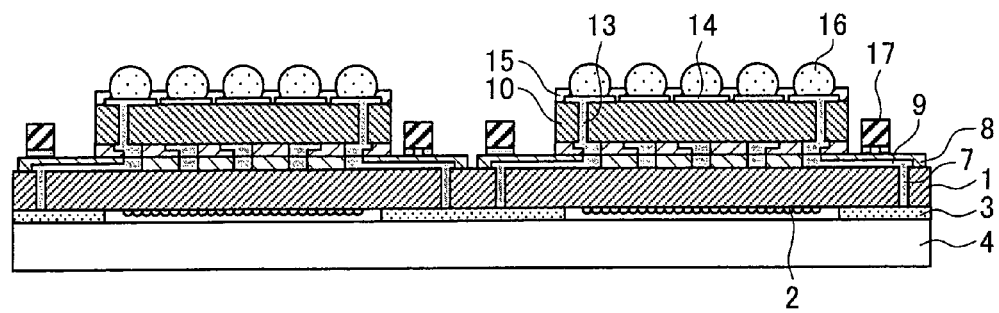
FIGS. 4(a) to 4(c) are schematic diagrams showing steps of producing the module example embodiment.
Figure 4:
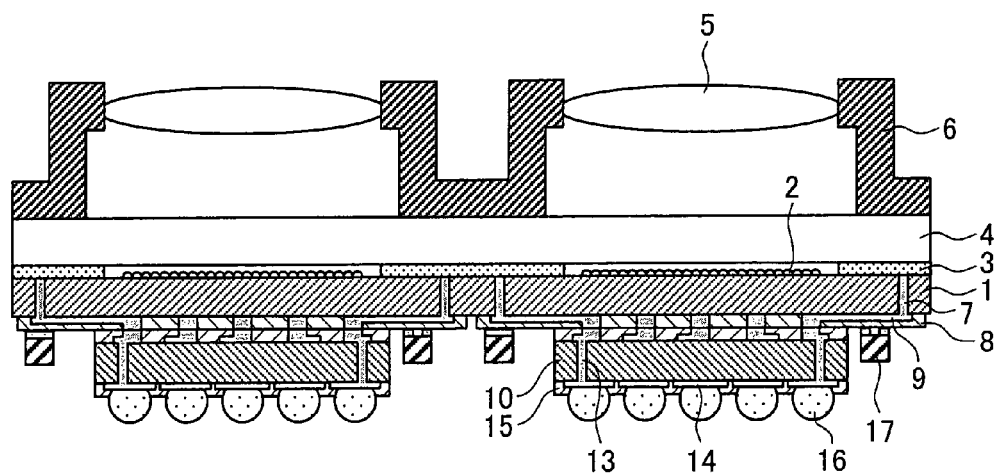
Figure 4:
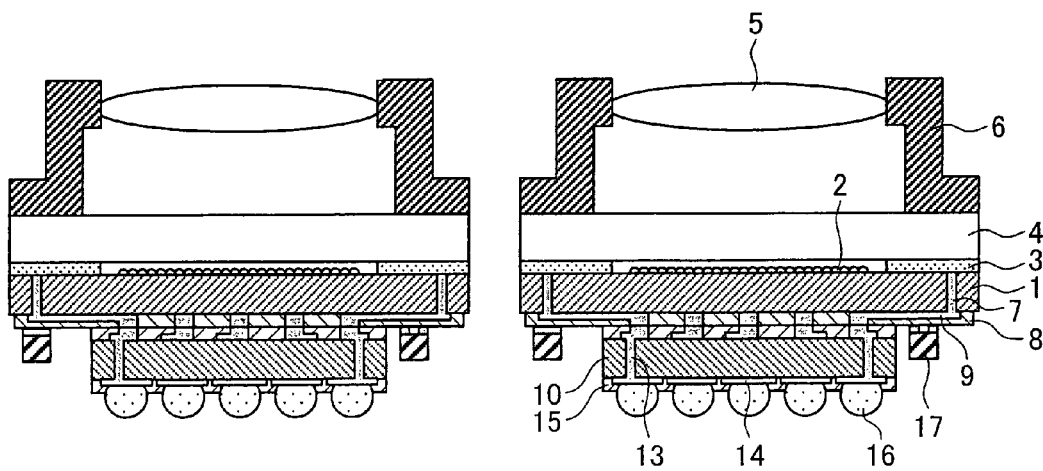

At this time, if the chip component 17 needs to be mounted, the chip component 17 is also mounted simultaneously, as shown in FIG. 4(*a*).

The solid-state image sensor 1 and the image processing apparatus 10 may be joined together by using any other method. In place of the anisotropic and conductive bonding agent, for example Au—Sn diffused junction may be carried out by use of Au and Sn in the protruded electrode.

Then, as shown in FIG. 4(*b*), the optical-path defining units 6 are mounted directly on the front surface of the transparent cover section 4 mounted on the solid-state image sensors 1. Bonding resin is applied to the front surface of the optical-path defining units 6. The effective pixel areas 2 of the solid-state image sensors 1 are aligned with optical axes of the lenses 5 held on the optical-path defining units 6. Then, the optical-path defining units 6 are bonded collectively in such a way as to correspond to an arrangement of the solid-state image sensors 1, each of which is in the form of wafer (FIG. 4(*b*)).

The optical-path defining units 6 may be mounted to the solid-state image sensor 1 individually.

Lastly, the solid-state image sensors 1 and the optical-path defining units 6 are diced collectively to form the modules 20 (FIG. 4(*c*)).

As discussed above, the method of producing the module 20 in accordance with the present embodiment is adapted so that the method of producing the module 20 including (a) the solid-state image sensor 1 including, on a front surface of the solid-state image sensor, an effective pixel area 2 where photoelectric conversion is performed on incident light and (b) the image processing apparatus 10 provided in such a manner that a rear surface of the image processing apparatus faces a rear surface of the solid-state image sensor, and processing an electric signal produced in the effective pixel area as a result of the photoelectric conversion, includes forming an electric wiring of the module 20, including: forming the through electrodes 7 passing through the solid-state image sensor 1; forming the rear-surface rewiring 9 electrically connected to the through electrodes 7 and formed in such a way as to be re-wired to a necessary area in the rear surface of the solid-state image sensor 1; forming the rear-surface rewiring 12 electrically connected to the rewiring 9 and formed in such a way as to be re-wired to a necessary area in the rear surface of the image processing apparatus 10; forming the through electrodes 13 passing through the image processing apparatus 10 and electrically connected to the rear-surface rewiring 12; and forming the front-surface rewiring 14 electrically connected to the through electrodes 13 and formed in such a way as to be re-wired to a necessary area in the front surface of the image processing apparatus 10, the method further including forming, on the front surface of the image processing apparatus 10, a solder electrode 16 to be electrically connected to the front-surface rewiring layer 14.

With this method, a step of producing a wiring board is omissible, while the wiring board is necessary in an electric wiring of the conventional modules for optical apparatuses.

Further, the module 20 produced by this method needs no wiring board. This allows the module 20 to be reduced in size in the direction of laminate. Further, no space is necessary for the bonding wire and the conductor wiring connected to the bonding wire, while such space is necessary in the structure employing a bonding wire for electric connection. This allows the module 20 to be reduced in size in the direction along the front surface. Accordingly, a module 20 is realized that is reduced in size and has a high degree of freedom in design relating to connection of electronic components such as the chip component 17.

It is preferable that the method of producing the module 20 further include: fixing the transparent cover section 4 to the solid-state image sensor 1 via the bonding-agent layer 3 to cover the effective pixel area 2; and mounting, on the transparent cover section 4, an optical-path defining unit 6 in such a way as to be supported solely by the transparent cover section 4, the optical-path defining unit 6 defining an optical path to the effective pixel area 2, the optical-path defining unit 6 and the transparent cover section 4 being mounted, on the solid-state image sensor 1, in this order from a light incident side.

In this method, the optical-path defining unit 6, the transparent cover section 4, the solid-state image sensor 1, and the image processing apparatus 10 are produced individually and then mounted on top of another. This simplifies the steps in producing, compared to the conventional structure in which a transparent cover section, a solid-state image sensor, and an image processing apparatus are squeezed in an area surrounded by a wiring board and an optical-path defining unit.

Further, no constraint is given on the components constituting the module 20, in contrast to the conventional structure in which the transparent cover section, the solid-state image sensor, and the image processing apparatus are squeezed in the area surrounded by the wiring board and the optical-path defining unit. This makes it possible to prevent defects such as overall distortion and partial breakage in the module 20. Therefore, the yield is improved, and production costs are reduced. Further, the optical-path defining unit 6 is provided in such a way as to be supported solely by the transparent cover section 4. This makes it possible to omit the adjustment section in between the optical-path defining unit and the wiring board, while such adjustment section is necessary in the conventional structure employing a wiring board. Therefore, the number of components is reduced, and the production steps are simplified.

Accordingly, with the method of the present invention, not only reduction in size but also reduction in costs of the module for an optical apparatus are attained at the same time.

It is preferable in the method of producing a module for an optical apparatus that the bonding-agent layer 3 include a photosensitive bonding agent.

With this structure, the bonding-agent layer 3 is photosensitive. Because the bonding-agent layer 3 is photosensitive, a pattern of the bonding-agent layer 3 is formed easily and highly accurately by using a photolithography technique, such as exposure and developing. Accordingly, the bonding-agent layer 3 is formed highly accurately, even if an area excluding the effective pixel area 2 in the front surface of the solid-state image sensor 1 is narrow. Therefore, production steps are simplified, the yield is improved, and production costs are reduced.

Figure 5:
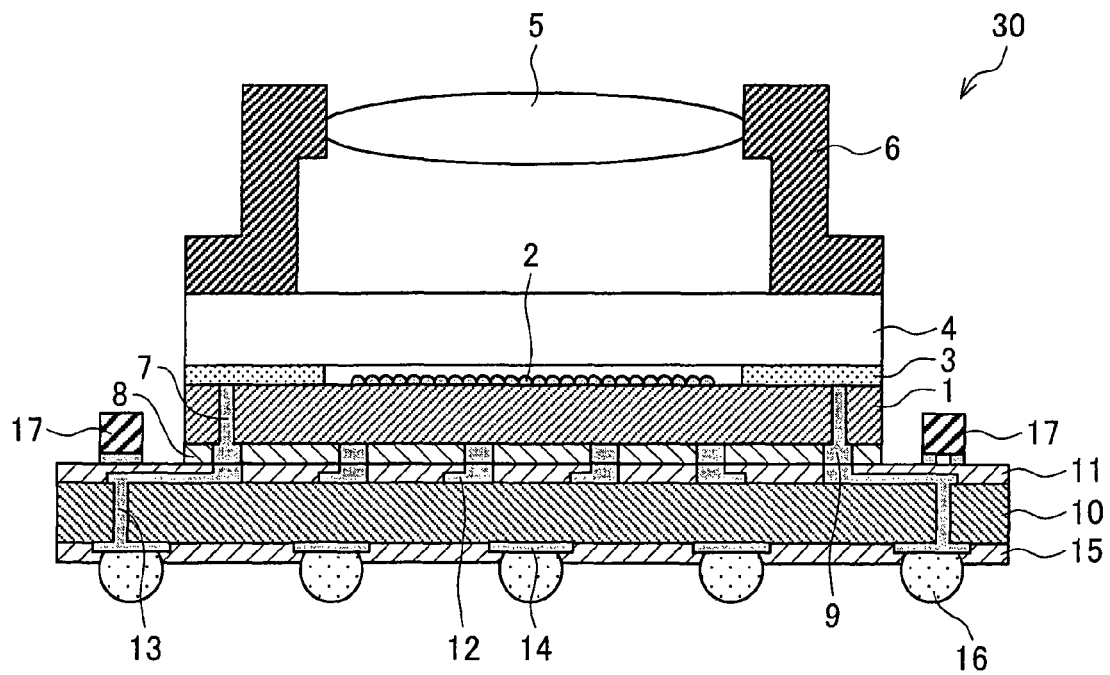
FIG. 5 is a sectional view showing a structure of a module for an optical apparatus, according to another embodiment of the present invention example embodiment.

The following explains a structure of a module for an optical apparatus, according to another embodiment of the present invention, with reference to FIG. 5.

As shown in FIG. 5, in the module 30 for an optical apparatus, the perimeter of the image processing apparatus 10 is longer than the perimeter of the solid-state image sensor 1. The perimeter of the image processing apparatus 10 comes outside, in the direction along the front surface, of the perimeter of the solid-state image sensor 1. The rest of the structure of the module 30 is same as that of the module 20. Therefore, explanation thereof is omitted.

In the module 30, the optical-path defining unit 6 is supported solely by the transparent cover section 4, in the same manner as in the module 20. The optical-path defining unit 6, the transparent cover section 4, and the solid-state image sensor 1 are mounted in this order from a light incident side. The perimeter of the solid-state image sensor 1, the perimeter of the transparent cover section 4, and the perimeter of the optical-path defining unit 6 align in the direction along the front surface. The solid-state image sensor 1, the transparent cover section 4, and the optical-path defining unit 6 form a compact laminate. Further, the perimeter of the image processing apparatus 10 is longer than the perimeter of the solid-state image sensor 1. Electronic components such as the chip component 17 are mounted, without a trouble, on a desired area in the rear surface of the image processing apparatus 10, in which area the solid-state image sensor 1 is not mounted, and forms wire connection.

Figure 6:
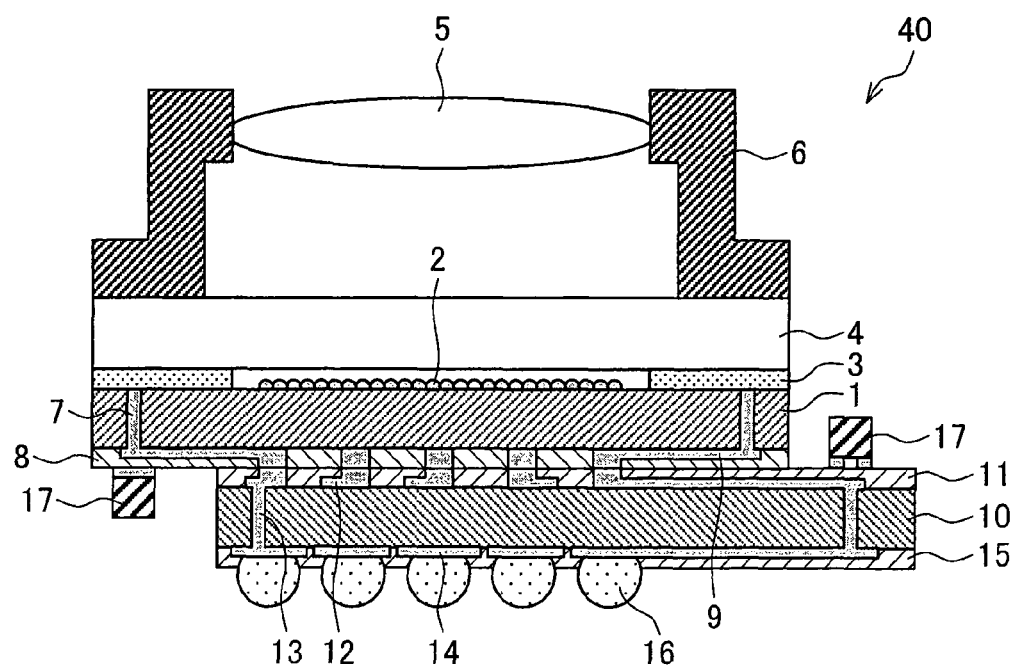
FIG. 6 is a sectional view showing a structure of a module for an optical apparatus, according to another embodiment of the present invention example embodiment.
Figure 7:
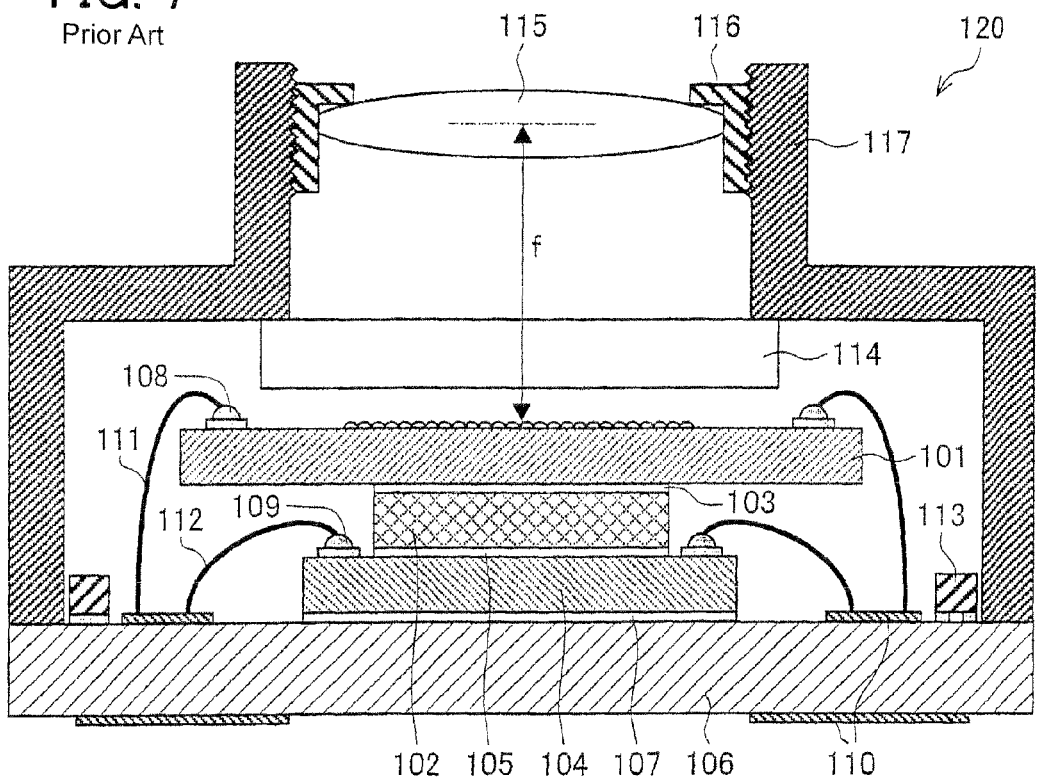
FIG. 7 is a sectional view showing a structure of a conventional module for an optical apparatus.
Figure 8:
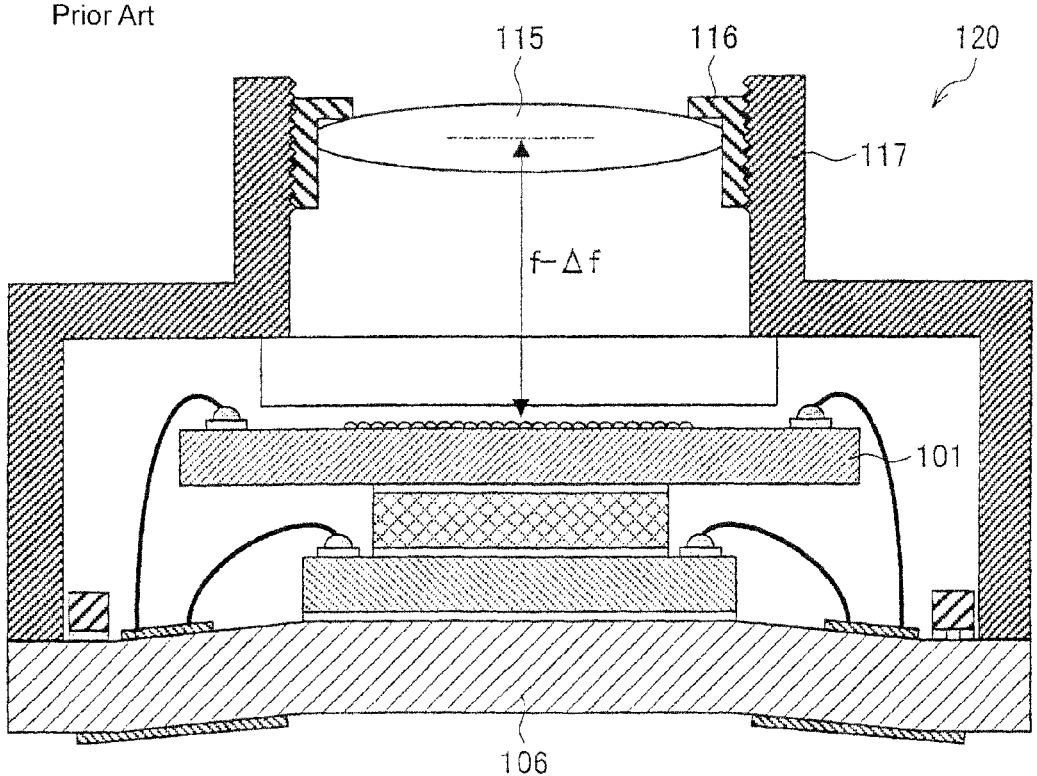
FIG. 8 is a schematic diagram of the conventional module for an optical apparatus.
Figure 9:
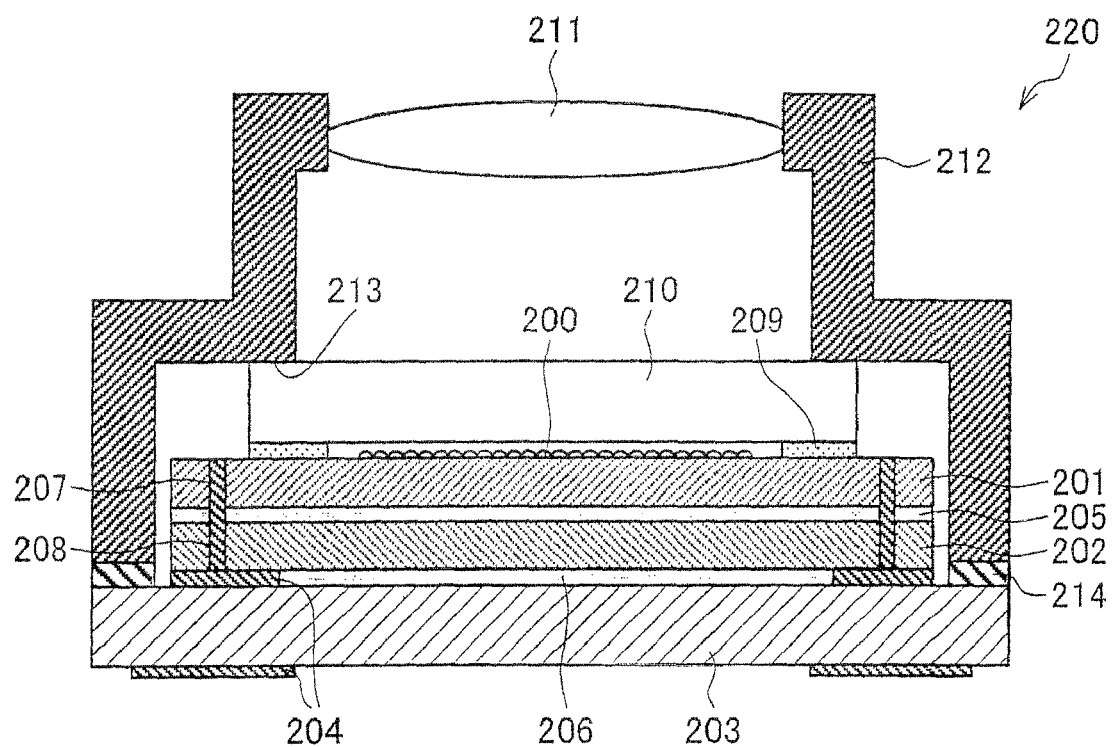
FIG. 9 is a sectional view showing a structure of another conventional module for an optical apparatus.

The following explains a structure of a module for an optical apparatus, according to another embodiment of the present invention, with reference to FIG. 6.

As shown in FIG. 6, the module 40 for an optical apparatus is substantially same in size and shape as surfaces of the solid-state image sensor 1 and the image processing apparatus 10, via which surfaces the solid-state image sensor 1 and the image processing apparatus 10 are in contact with each other. The solid-state image sensor 1 and the image processing apparatus 10 are mounted on top of another in such a way as to deviate from each other in the direction along the front surface. The rest of the structure of the module 40 is same as that of the module 20. Therefore, explanation thereof is omitted.

The module 40 includes an area in the rear surface of the solid-state image sensor 1, at which area the image processing apparatus 10 is not mounted. Further, there is an area in the rear surface of the image processing apparatus 10, at which area the solid-state image sensor 1 is not mounted. Hence, it is possible to place electronic components such as the chip component 17 in the areas without a trouble, and form wire connection.

As the foregoing discusses, with the module of the present embodiment, no wiring board is necessary, and therefore the degree of freedom in design increases. Accordingly, it is possible to, for example place the chip component 17 on a desired area in the rear surface of the solid-state image sensor 1 and/or the rear surface of the image processing apparatus 10 without a trouble, and form wire connection.

The module of the present invention is suitably applied to a light and small optical apparatus, such as a digital camera and a portable phone with a camera function.

As discussed above, a module of the example embodiment for an optical apparatus includes:

a solid-state image sensor including, on a front surface of the solid-state image sensor, an effective pixel area where photoelectric conversion is performed on incident light; an image processing apparatus provided in such a manner that a rear surface of the image processing apparatus faces a rear surface of the solid-state image sensor, and processing an electric signal produced in the effective pixel area as a result of the photoelectric conversion; and an electric wiring including: a first through electrode passing through the solid-state image sensor; a first rewiring layer electrically connected to the first through electrode and formed in such a way as to be re-wired to a necessary area in the rear surface of the solid-state image sensor; a second rewiring layer electrically connected to the first rewiring layer and formed in such a way as to be re-wired to a necessary area in the rear surface of the image processing apparatus; a second through electrode passing through the image processing apparatus and electrically connected to the second rewiring layer; and a third rewiring layer electrically connected to the second through electrode and formed in such a way as to be re-wired to a necessary area in a front surface of the image processing apparatus, the image processing apparatus including an external connection terminal electrically connected to the third rewiring layer.

With this structure, the first rewiring layer of the solid-state image sensor and the second and third rewiring layers of the image processing apparatus function as an electric wiring of a wiring board. This allows an electric wiring of the module to be constituted of: the first through electrode passing through the solid-state image sensor; the first rewiring layer being formed in such a way as to be re-wired to a necessary area in the rear surface of the solid-state image sensor; the second through electrode passing through the image processing apparatus; the second rewiring layer being formed in such a way as to be re-wired to a necessary area in the rear surface of the image processing apparatus; and the third rewiring layer being formed in such a way as to be re-wired to a necessary area in the front surface of the image processing apparatus.

Because no wiring board is necessary, the size of the module is reduced in the direction of laminate. Further, no space is necessary for the bonding wire and the conductor wiring connected to the bonding wire, while such space is necessary in the structure employing a bonding wire for electric connection. This allows the module to be reduced in size in the direction along the front surface. Accordingly, a module is realized that is reduced in size and has a high degree of freedom in design relating to connection of electronic components such as a chip component.

It is preferable that the module for an optical apparatus further include an optical-path defining unit to define an optical path to the effective pixel area, and a transparent cover section to cover the effective pixel area, the optical-path defining unit, the transparent cover section, the solid-state image sensor, and the image processing apparatus being mounted in this order from a light incident side, the transparent cover section being fixed to the solid-state image sensor via the bonding section, and the optical-path defining unit being supported solely by the transparent cover section.

With this structure, the optical-path defining unit, the transparent cover section, the solid-state image sensor, and the image processing apparatus are mounted on top of another. This makes it possible to prevent defects, such as overall distortion and partial breakage in the module, without giving a constraint on the structure of the module. Further, the optical-path defining unit is supported solely by the transparent cover section. Therefore, the optical-path defining unit is closely fixed to the transparent cover section, compared to the conventional structure including a wiring board and an optical-path defining unit being fixed not only to a transparent cover section but also to the wiring board via an adjustment section. This allows the optical-path defining unit to be fixed more stably. Further, the adjustment section is omissible. Therefore, the number of components is reduced, and the steps in production are simplified. Accordingly, not only reduction in size but also reduction in costs of the module of the present embodiment are attained at the same time.

It is preferable in the module for an optical apparatus that the optical-path defining unit and the transparent cover section be mounted on top of another in a manner such that the perimeter of the optical-path defining unit and the perimeter of the transparent cover section substantially align in the direction along the front surface.

Further, it is preferable that the perimeter of the solid-state image sensor substantially align, in the direction along the front surface, with the perimeter of the optical-path defining unit and the perimeter of the transparent cover section.

With this structure, a more compact and stable laminate is realized without giving a constraint on the structure of the module.

It is preferable in the module for an optical apparatus that the bonding section be formed to surround the effective pixel area and to form a space in between the effective pixel area and the transparent cover section.

If, for example, the bonding section is formed in between the effective pixel area and the transparent cover section, loss of light such as attenuation and scattering occurs when incident light passes through the bonding section. On the other hand, with the above structure, light incident on the module passes merely through a space and does not pass through the bonding section or the like, after passing through the transparent cover section and before reaching the effective pixel area formed on the front surface of the solid-state image sensor. Accordingly, a module is realized that is optically more advantageous than a module including a bonding section on an effective pixel area.

Further, it is preferable in the module for an optical apparatus that the bonding section seal an area surrounding the effective pixel area.

With this structure, the bonding section seals a space in between the solid-state image sensor and the transparent cover section. This prevents moisture from entering the effective pixel area and dust (dirt, scraps, etc.) from adhering to the effective pixel area. This improves reliability of the solid-state image sensor, and therefore improves reliability of the module for an optical apparatus.

It is preferable in the module for an optical apparatus that the optical-path defining unit hold a lens provided in such a way as to face the effective pixel area.

With this structure, the optical-path defining unit, which holds the lens, is closely fixed to the transparent cover section. This allows the optical distance, which is from the lens to the solid-state image sensor, to match the focal length of the lens more assuredly. Hence, no deviation occurs in the optical distance, while such deviation is observed in the conventional modules for optical apparatuses due to external factors such as warping or deflection in the wiring board. Accordingly, it is possible to reduce the size of the module that requires no adjustment of the focal length, without giving a constraint on the structure of the module.

In the module for an optical apparatus, the perimeter of the image processing apparatus is shorter than the perimeter of the solid-state image sensor, and the perimeter of the image processing apparatus comes inside, in the direction along the front surface, of the perimeter of the solid-state image sensor.

With this structure, the chip component is mounted on a desired area in the front surface of the solid-state image sensor without a trouble, in which area the image processing apparatus is not mounted.

Further, the module for an optical apparatus may include a chip component mounted on the rear surface of the solid-state image sensor and electrically connected to the first rewiring layer.

Further, in the module for an optical apparatus, the perimeter of the solid-state image sensor may be shorter than the perimeter of the image processing apparatus, and the perimeter of the image processing apparatus may come outside, in the direction along the front surface, of the perimeter of the solid-state image sensor.

Further, it is also possible to include a chip component mounted on the rear surface of the image processing apparatus and electrically connected to the second rewiring layer.

Further, the perimeter of the solid-state image sensor and the perimeter of the image processing apparatus may be substantially same in length and shape, and the perimeter of the solid-state image sensor and the perimeter of the image processing apparatus may deviate from each other in the direction along the front surface.

Further, the module for an optical apparatus may include a chip component mounted on the rear surface of the solid-state image sensor and electrically connected to the first rewiring layer, and a chip component mounted on the rear surface of the image processing apparatus and electrically connected to the second rewiring layer.

The module of the example embodiment presented herein requires no wiring board and has a compact structure of laminate. This allows the degree of freedom in design to increase. Therefore, the chip component is mounted, without a trouble, on (a) a desired area in the rear surface of the solid-state image sensor, in which area the image processing apparatus is not provided, and/or (b) a desired area in the rear surface of the image processing apparatus, in which area the laminate is not mounted, for example.

The module for an optical apparatus may be structured in a manner such that the image processing apparatus includes a plurality of terminals, and only a terminal to be connected to the solid-state image sensor and a terminal to be connected to the chip component, among the plurality of terminals, are connected to the second rewiring layer via the second through electrode.

With this structure, the yield of the image processing apparatus is improved by reducing, to a minimum, the number of the second through electrodes to be formed in the image processing apparatus. This allows reduction in costs.

The method of producing a module for an optical apparatus in accordance with the present embodiment, which module includes (a) a solid-state image sensor including, on a front surface of the solid-state image sensor, an effective pixel area where photoelectric conversion is performed on incident light, and (b) an image processing apparatus provided in such a manner that a rear surface of the image processing apparatus faces a rear surface of the solid-state image sensor, and processing an electric signal produced in the effective pixel area as a result of the photoelectric conversion, includes: forming an electric wiring of the module, including: forming a first through electrode passing through the solid-state image sensor; forming a first rewiring layer electrically connected to the first through electrode and formed in such a way as to be re-wired to a necessary area in the rear surface of the solid-state image sensor; forming a second rewiring layer electrically connected to the first rewiring layer and formed in such a way as to be re-wired to a necessary area in the rear surface of the image processing apparatus; forming a second through electrode passing through the image processing apparatus and electrically connected to the second rewiring layer; and forming a third rewiring layer electrically connected to the second through electrode and formed in such a way as to be re-wired to a necessary area in a front surface of the image processing apparatus, the method further comprising forming, on the front surface of the image processing apparatus, an external connection terminal electrically connected to the third rewiring layer.

It is possible to omit the step of producing a wiring board, which step is necessary in an electric wiring of a conventional module for an optical apparatus.

Further, the module produced by the above method requires no wiring board. This allows the module to be reduced in size in the direction of laminate. Further, no space is necessary for the bonding wire and the conductor wiring connected to the bonding wire, while such space is necessary in the structure employing a bonding wire for electric connection. This allows the module to be reduced in size in the direction along the front surface. Accordingly, a module is realized that is reduced in size and has a high degree of freedom in design relating to connection of electronic components such as a chip component.

It is preferable that the method of producing the module for an optical apparatus further includes: fixing a transparent cover section to the solid-state image sensor via a bonding section to cover the effective pixel area; and mounting, on the transparent cover section, an optical-path defining unit in such a way as to be supported solely by the transparent cover section, the optical-path defining unit defining an optical path to the effective pixel area, and the optical-path defining unit and the transparent cover section being mounted, on the solid-state image sensor, in this order from a light incident side.

With this method, the optical-path defining unit, the transparent cover section, the solid-state image sensor, and the image processing apparatus are produced individually, and then mounted on top of another. This simplifies the steps in production, compared to the conventional structure in which the transparent cover section, the solid-state image sensor, and the image processing apparatus are squeezed in the area surrounded by the wiring board an the optical-path defining unit.

Further, no constraint is given on the components constituting the module, in contrast to the conventional production method in which the transparent cover section, the solid-state image sensor, and the image processing apparatus are squeezed in the area surrounded by the wiring board and the optical-path defining unit. This prevents defects, such as such as overall distortion and partial breakage in the module. Therefore, the yield is improved, and production costs are reduced. Further, the optical-path defining unit is formed in such a way as to be supported solely by the transparent cover section. Therefore, it is possible to omit the adjustment section in between the optical-path defining unit and the wiring board, while such adjustment section is necessary in the conventional structure employing a wiring board. Accordingly, the number of components is reduced, and the steps in production are simplified.

With the method of the present embodiment, not only reduction in size of the module but also reduction in costs for producing the module are attained at the same time.

It is preferable in the method of producing the module for an optical apparatus that the bonding section include a photosensitive bonding agent.

With this structure, the bonding section is photosensitive. This allows a pattern of the bonding section to be formed easily and highly accurately by using a photolithography technique, such as exposure and developing. Accordingly, the bonding section is formed highly accurately, even if an area excluding the effective pixel area in the front surface of the solid-state image sensor is narrow. This simplifies the steps in production, and improves the yield. Therefore, production costs are reduced.

The embodiments and concrete examples of implementation discussed in the foregoing detailed explanation serve solely to illustrate the technical details, which should not be narrowly interpreted within the limits of such embodiments and concrete examples, but rather may be applied in many variations within the spirit of the present example embodiment, provided such variations do not exceed the scope of the patent claims set forth below.

What is claimed is:

1. A module for an optical apparatus, comprising:
a solid-state image sensor including, on a front surface of the solid-state image sensor, an effective pixel area where photoelectric conversion is performed on incident light;
an image processing apparatus provided in such a manner that a rear surface of the image processing apparatus faces a rear surface of the solid-state image sensor, and processing an electric signal produced in the effective pixel area as a result of the photoelectric conversion; and
an electric wiring being constituted of:
  a first through electrode passing through the solid-state image sensor;
  a first rewiring layer electrically connected to the first through electrode and formed in such a way as to be re-wired to a necessary area in the rear surface of the solid-state image sensor;
  a second rewiring layer electrically connected to the first rewiring layer and formed in such a way as to be re-wired to a necessary area in the rear surface of the image processing apparatus;
  a second through electrode passing through the image processing apparatus and electrically connected to the second rewiring layer; and
  a third rewiring layer electrically connected to the second through electrode and formed in such a way as to be re-wired to a necessary area in a front surface of the image processing apparatus,
the module including no wiring board that has an electrical wiring of the module, and
the image processing apparatus including an external connection terminal electrically connected to the third rewiring layer.

2. The module of claim 1, further comprising:
an optical-path defining unit to define an optical path to the effective pixel area; and
a transparent cover section provided to cover the effective pixel area,
the optical-path defining unit, the transparent cover section, the solid-state image sensor, and the image processing apparatus being stacked in this order from a light incident side,
the transparent cover section being fixed to the solid-state image sensor via a bonding section, and
the optical-path defining unit being supported solely by the transparent cover section.

3. The module of claim 2, wherein a perimeter of the optical-path defining unit and a perimeter of the transparent cover section substantially align in a direction along the front surface.

4. The module of claim 3, wherein a perimeter of the solid-state image sensor substantially aligns, in the direction along the front surface, with the perimeter of the optical-path defining unit and the perimeter of the transparent cover section.

5. The module of claim 2, wherein the bonding section is formed to surround the effective pixel area and to form a space in between the effective pixel area and the transparent cover section.

6. The module of claim 5, wherein the bonding section seals an area surrounding the effective pixel area.

7. The module of claim 2, wherein the optical-path defining unit holds a lens provided in such a way as to face the effective pixel area.

8. The module of claim 1, wherein:
a perimeter of the image processing apparatus is shorter than a perimeter of the solid-state image sensor; and
the perimeter of the image processing apparatus comes inside, in a direction along the front surface, of the perimeter of the solid-state image sensor.

9. The module of claim 8, further comprising a chip component mounted on the rear surface of the solid-state image sensor and electrically connected to the first rewiring layer.

10. The module of claim 1, wherein:
the image processing apparatus includes a plurality of terminals; and
among the plurality of terminals, only a terminal to be connected to the solid-state image sensor is connected to the second rewiring layer via the second through electrode.

11. A method of producing a module for an optical apparatus, which module including (a) a solid-state image sensor including, on a front surface of the solid-state image sensor, an effective pixel area where photoelectric conversion is performed on incident light, and (b) an image processing apparatus provided in such a manner that a rear surface of the image processing apparatus faces a rear surface of the solid-state image sensor, and processing an electric signal produced in the effective pixel area as a result of the photoelectric conversion, the module including no wiring board that has an electric wiring of the module,
the method comprising:
forming an electric wiring of the module being constituted of a first through electrode, a first rewiring layer, a second rewiring layer, a second through electrode, and a third rewiring layer, including:
forming the first through electrode passing through the solid-state image sensor;
forming the first rewiring layer electrically connected to the first through electrode and formed in such a way as to be re-wired to a necessary area in the rear surface of the solid-state image sensor;
forming the second rewiring layer electrically connected to the first rewiring layer and formed in such a way as to be re-wired to a necessary area in the rear surface of the image processing apparatus;
forming the second through electrode passing through the image processing apparatus and electrically connected to the second rewiring layer; and
forming the third rewiring layer electrically connected to the second through electrode and formed in such a way as to be re-wired to a necessary area in a front surface of the image processing apparatus,
the method further comprising forming, on the front surface of the image processing apparatus, an external connection terminal electrically connected to the third rewiring layer.

12. The method of claim 11, further comprising:
fixing a transparent cover section to the solid-state image sensor via a bonding section to cover the effective pixel area; and
mounting, on the transparent cover section, an optical-path defining unit in such a way as to be supported solely by the transparent cover section, the optical-path defining unit defining an optical path to the effective pixel area,
the optical-path defining unit and the transparent cover section being mounted, on the solid-state image sensor, in this order from a light incident side.

13. The method of claim 12, wherein the bonding section includes a photosensitive bonding agent.

* * * * *